United States Patent
Lee

(10) Patent No.: US 8,830,769 B2
(45) Date of Patent: Sep. 9, 2014

(54) MEMORY DEVICE AND SIGNAL DRIVING DEVICE THEREOF

(75) Inventor: Seong Hoon Lee, San Jose, CA (US)

(73) Assignee: Nanya Technology Corporation, Tao-Yuan Hsien (TW)

( * ) Notice: Subject to any disclaimer, the term of this patent is extended or adjusted under 35 U.S.C. 154(b) by 315 days.

(21) Appl. No.: 13/484,541

(22) Filed: May 31, 2012

(65) Prior Publication Data

US 2013/0322196 A1    Dec. 5, 2013

(51) Int. Cl.
*G11C 5/14*    (2006.01)

(52) U.S. Cl.
USPC .......... 365/189.09; 365/207; 365/230.02; 365/230.09; 365/225.6

(58) Field of Classification Search
CPC .. G11C 11/4074; G11C 7/062; G11C 7/1048; G11C 7/22; H03K 5/2481
USPC .......... 365/207, 205, 214, 189.08, 189.09, 365/230.05, 230.02, 230.09, 225.6
See application file for complete search history.

(56) References Cited

U.S. PATENT DOCUMENTS

| | | | |
|---|---|---|---|
| 2003/0043129 A1* | 3/2003 | Tazuke .......................... | 345/204 |
| 2003/0151967 A1* | 8/2003 | Nagai et al. .................. | 365/226 |
| 2009/0102544 A1* | 4/2009 | Okamoto et al. ............. | 327/540 |

* cited by examiner

*Primary Examiner* — Hien Nguyen
(74) *Attorney, Agent, or Firm* — Ming Chow; Sinorica, LLC

(57) ABSTRACT

A signal driving device includes a constant current circuit configured to provide a constant current, a first mirror circuit configured to generate a mirror current from the constant current and provide a voltage according to the mirror current of the constant current, a circuit comprising a switch device and configured to provide a driver current, a second mirror circuit configured to generate a mirror current of the driver current and output a voltage that includes a voltage drop caused when the mirror current of the driver current flows through a replica switch device, and a differential amplifier configured to receive the voltage from the first mirror circuit and the voltage from the second mirror circuit to provide a biased voltage for the bias circuit and thereby induce the driver current.

18 Claims, 5 Drawing Sheets

MEMORY DEVICE AND SIGNAL DRIVING DEVICE THEREOF

BACKGROUND OF THE INVENTION

1. Technical Field

The present invention relates to a memory device and a signal driving device thereof.

2. Background

A signal driver for memory cells provides a larger signal at low supply voltage ($V_{CC}$). Usually, memory data is stored as small and weak signals and thus needs to be buffered by a signal driver and delivered to periphery circuitry in order to be read from a chip. A stronger signal driver increases the signal margin. However, there is a drawback to a stronger signal driver. Since the signal driver has to be placed repeatedly in a memory core, which is the most expensive area in terms of space in the memory chip, enlarging the driver size has a direct impact on chip size and thus on chip cost. Additionally, signal margin is usually too small for low $V_{CC}$ situations.

FIG. 1 shows a conventional signal driver 10. Referring to FIG. 1, the conventional signal driver 10 includes a constant current circuit 11 and a bias circuit 12. The constant current circuit 11 includes a constant current source 110 and a sixth MOS transistor 111. The bias circuit 12 includes a first switch MOS transistor 101, a second switch MOS transistor 102, a third switch MOS transistor 103, a fourth switch MOS transistor 104 and a bias MOS transistor 105. The constant current source 110 provides a constant current Iref. A voltage LBias is provided by the sixth MOS transistor 111 for the gate 109 of the fifth MOS transistor 105. The bias voltage LBias controls the fifth MOS transistor 105 to provide a driving current $I_{OD}$. A signal Lio is applied to the gate 106 of the first switch MOS transistor 101 and a signal LioF is applied to the gate 107 of the second switch MOS transistor 102, and both are launched onto global IO lines Gio/GioF to be read out to periphery circuitry. The third switch MOS transistor 103 and the fourth MOS transistor 104 are both switch controlled by Rsel 108 as the function of a read select signal. The fifth MOS transistor 105 controls the current $I_{OD}$ under the bias voltage LBias 109. Because the resistances of the switch MOS transistors 107 and 108 are very sensitive, the switch MOS transistors 107 and 108 should be large enough to avoid an excessive current-resistance drop at low $V_{CC}$. However, the large switch MOS transistors 107 and 108 enlarge the driver size, causing a direct impact on chip size and chip cost.

SUMMARY

In one embodiment of the present invention, a signal driving device comprises a constant current circuit, a first mirror circuit, a circuit, a second mirror circuit, and a differential amplifier. The constant current circuit is configured to provide a constant current. The first mirror circuit is configured to generate a mirror current of the constant current and provides a voltage according to the mirror current of the constant current. The circuit comprises a switch device and is configured to provide a driver current. The second mirror circuit comprises a replica switch device, which is configured to generate a mirror current of the driver current and outputs a voltage that includes a voltage drop when the mirror current of the driver current flows through the replica switch device. The differential amplifier is configured to receive the voltage from the first mirror circuit and the voltage from the second mirror circuit to provide a biased voltage for the bias circuit to induce the driver current.

In one embodiment of the present invention, a signal driving device includes a signal driver, a differential amplifier, a first generating circuit, a constant current source, and a second generating circuit. The signal driver includes a first switch device that is configured to launch a data signal from a first signal line to a second signal line. The signal driver includes a second switch device that includes a gate end that is configured for application of a biased voltage to induce a driver current. The differential amplifier includes a first input and a second input. The first generating circuit includes a replica signal driver and a first resistor that connects a voltage source and the replica signal driver. The first generating circuit is configured to generate a mirror current of the driver current flowing through the first resistor to induce a first voltage between the first resistor and the replica signal driver, wherein the first voltage is applied to the first end of the differential amplifier. The constant current source generates a reference current. The second generating circuit includes a replica second switch device and a second resistor that connects the voltage source and the replica second switch device. The second generating circuit is configured to induce a mirror current of the reference current flowing through the second resistor to output a second voltage between the second resistor and the replica second switch device, wherein the second voltage is applied to the second input of the differential amplifier.

In one embodiment of the present invention, a memory device comprises a global input/output line and a local input/output line, a signal driver comprising a first switch device that is configured to launch a data signal from the local input/output line to the global input/output line, a differential amplifier comprising a first input and a second input, a first generating circuit comprising a replica signal driver and a first resistor that connects a voltage source and the replica signal driver, a constant current source generating a reference current, and a second generating circuit comprising a replica second switch device and a second resistor that connects the voltage source and the replica second switch device. The signal driver further comprises a second switch device comprising a gate end configured for application of a biased voltage to induce a driver current. The first generating circuit is configured to generate a mirror current of the driver current flowing through the first resistor to induce a first voltage between the first resistor and the replica signal driver, wherein the first voltage is applied to the first end of the differential amplifier. The second generating circuit is configured to induce a mirror current of the reference current flowing through the second resistor to output a second voltage between the second resistor and the replica second switch device, wherein the second voltage is applied to the second input of the differential amplifier.

DETAILED DESCRIPTION

Figure 2:
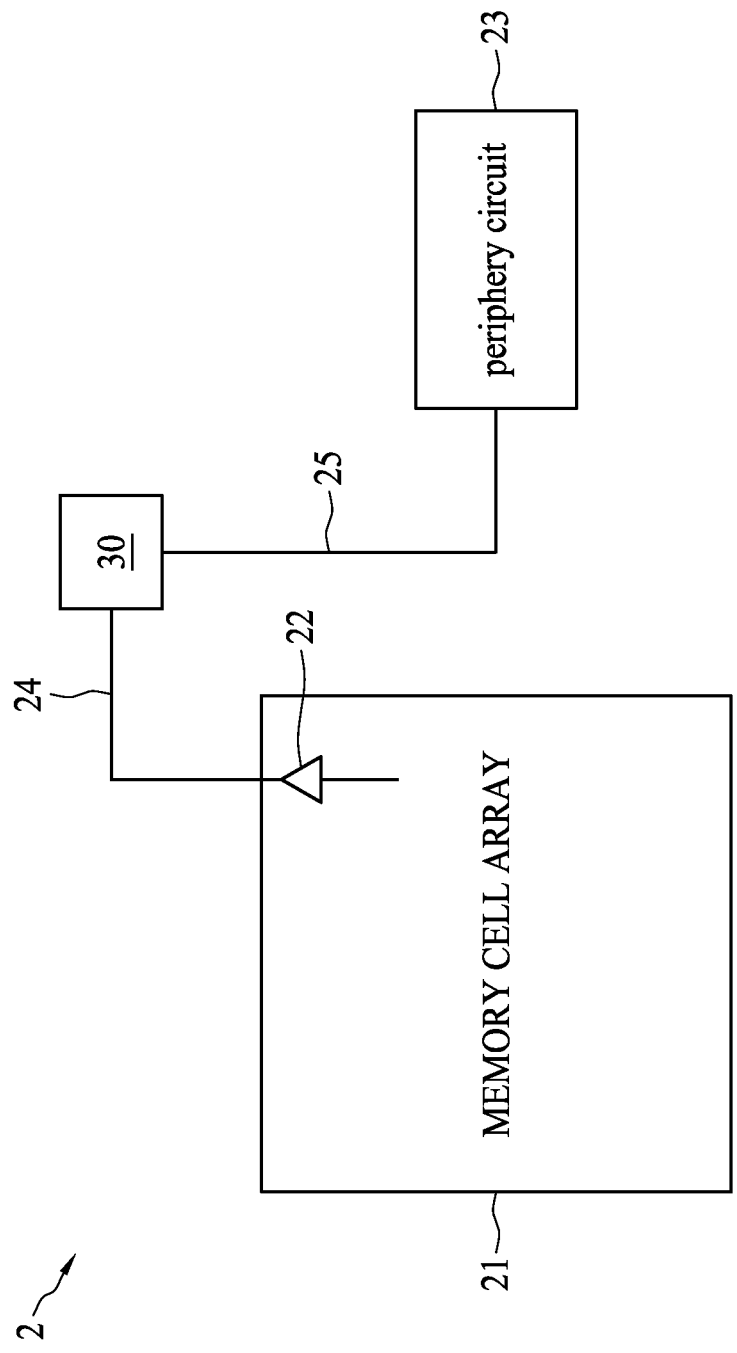
FIG. 2 schematically demonstrates a memory device according to one embodiment of the present invention.

As shown in FIG. 2, in some embodiments of the present invention, a memory device 2 may comprise a memory cell array 21, a signal driving device 30, and a periphery circuit 23. The memory cell array 21 may comprise a plurality of memory cells for storing information and a plurality of sense amplifiers 22 configured to amplify the information stored in the corresponding memory cells. The signal driving device 30 couples to at least one corresponding sense amplifier 22 by a signal line 24, such as a local input/output line, and the signal driving device 30 couples to the periphery circuit 23 configured to receive amplified output information from the memory cell array 21 by a signal line 25, such as a global input/output line. The memory device 2 may be a DRAM memory, a Flash memory, or the like.

Figure 3:
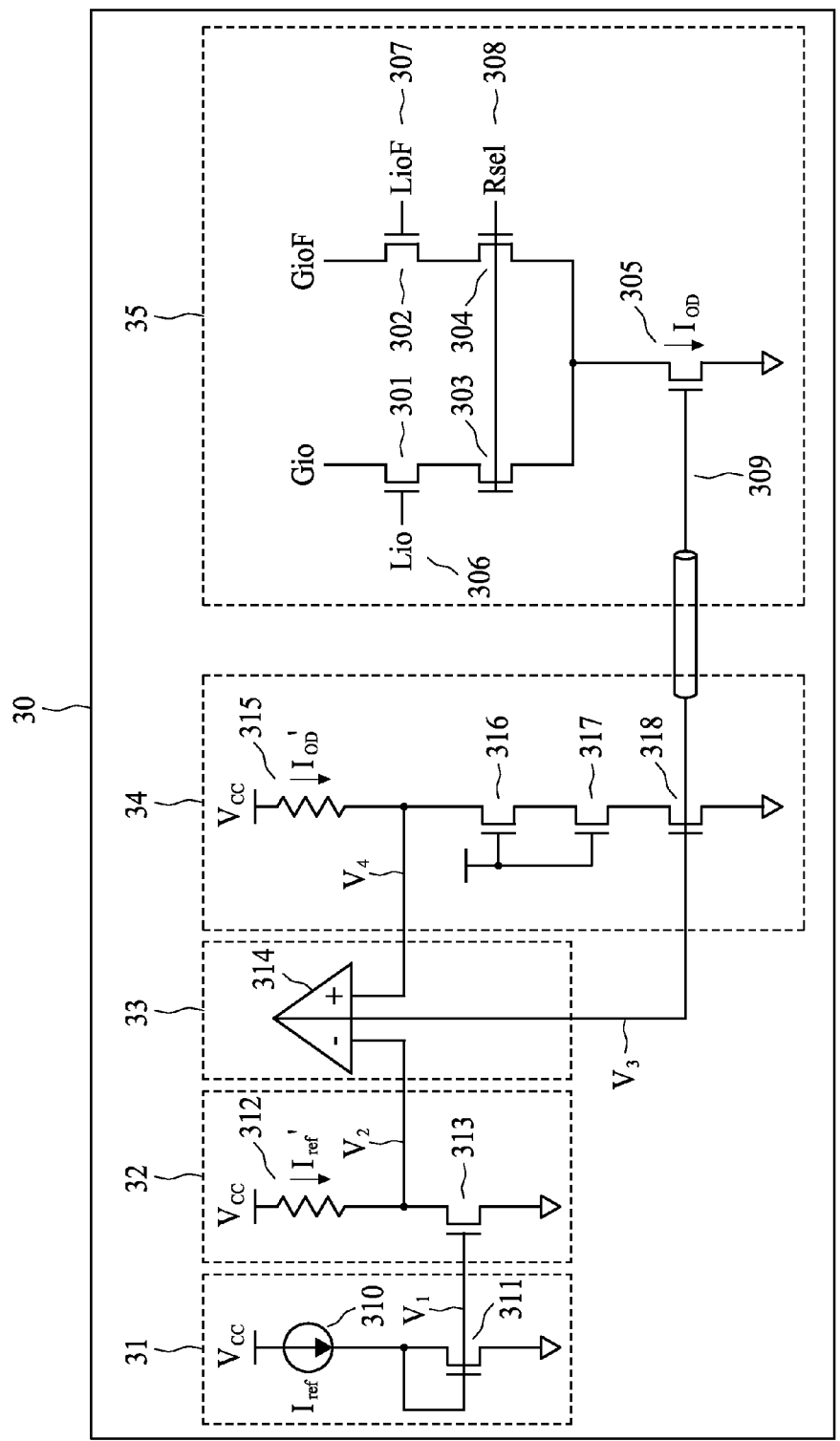
FIG. 3 schematically demonstrates a signal driving device and a reference generator according to one embodiment of the present invention.

As shown in FIG. 3, the signal driving device 30 includes a constant current circuit 31, a generating circuit or a first mirror circuit 32, a differential amplifier 33, a generating circuit or a second mirror circuit 34, and a signal driver or a bias circuit 35. The constant current circuit 31 includes a constant current source 310 and a switch device 311 that may comprise a MOS transistor. The first mirror circuit 32 includes a first resistor 312 and a switch device 313 that may comprise a MOS transistor. The differential amplifier 33 includes a differential amplifier circuit 314. The second mirror circuit 34 includes a second resistor 315, a switch device 316 that may comprise a MOS transistor, another switch device 317 that may comprise a MOS transistor, and yet another switch device 318 that may comprise a MOS transistor. The bias circuit 35 includes a switch device 302 that may comprise a MOS transistor, another switch device 304 that may comprise a MOS transistor, another switch device 305 that may comprise a MOS transistor, another switch device 301 that may comprise a MOS transistor, and another switch device 303 that may comprise a MOS transistor. A gate terminal LioF 307 is used to control the switching of the switch device 302 and may connect to a local input/output line. A selection line connects to the gates of the switch device 304 and the switch device 303. A local input/output line 306 may connect to the switch device 301. A gate terminal 309 is used to control the switching of the switch device 305.

The constant current source 310 provides a constant current Iref in the constant current circuit and the constant current Iref is mirrored to a mirror current Iref that may flow through a resistor 312 in the first mirror circuit 32. The first switch device 311 provides a bias voltage to the gate end of the second switch device 313 in the first mirror circuit 32. The switch device 313 can be a replica of the switch device 305 of the circuit 35.

The first mirror circuit 32 mirrors the Iref from the constant current circuit 31 to generate a mirror current Iref. The bias voltage $V_1$ in the first switch device 311 is also the bias voltage of the second switch device 313, which provides the bias and controls the mirror current Iref of the first mirror circuit 32. The mirror current Iref may flow through the resistor 312 and induce a voltage $V_2$ that is applied to one input of the differential amplifier circuit 314. In some embodiments, the switch device 313 may be a replica of the switch device 305.

A biased voltage $V_3$ can be applied to the bias circuit 35 to induce a bias current $I_{OD}$. In the circuit 35, one end of the switch device 302 connects to a global input/output line GioF, the gate end of the switch device 302 connects to a local input/output line LioF, and another end of the switch device 302 connects one end of the switch device 304. The gate end of the switch device 304 connects to a selection line Rsel, and another end of the switch device 304 connects to one end of the switch device 305. When a select signal is applied to the gate end of the switch device 304, a data signal can be launched from the local input/output line LioF to the global input/output line GioF.

Similarly, one end of the switch device 301 connects to a global input/output line Gio, the gate end of the switch device 301 connects to a local input/output line Lio, and another end of the switch device 301 connects to one end of the switch device 303. The gate end of the switch device 303 connects to the selection line Rsel, and another end of the switch device 303 connects to the end of the switch device 305 that connects to the switch device 304. When a select signal is applied to the gate end of the switch device 103, a data signal can be launched from the local input/output line Lio to the global input/output line Gio.

As shown in FIG. 3, one end of the switch device 305 connects to a ground and the gate end of the switch device 305, to which a bias voltage $V_3$ is applied. The switch device 305 is configured to set the driving strength of the circuit 35.

In the second mirror circuit 34, the resistor 315 comprises one end connecting to a voltage source $V_{CC}$ and another end connecting to one end of the switch device 316. The switch device 316 is a replica of the switch device 307. Another end of the switch device 316 connects to one end of the switch device 317, and another end of the switch device 317 connects to one end of the switch device 318. The switch device 317 can be a replica of the switch device 308. As such, the resistance of the switch devices 316 and 317 can be substantially similar to the resistance of the switch devices 307 and 308. Both the gate ends of the switch devices 316 and 317 may connect together to an electrical source. Moreover, one end of the switch device 318 connects to one end of the switch device 317 and another end of the switch device 318 connects to a ground. The switch device 318 can be a replica of the switch device 305. The bias voltage $V_3$ is also applied to the gate end of the switch device 318.

The second mirror circuit 34 is configured to generate a mirror current $I_{OD}'$ of the current $I_{OD}$ of the bias circuit 35. The current $I_{OD}'$ may flow through the resistor 315 and generate a voltage $V_4$ between the resistor 315 and the switch device 316. The voltage $V_4$ is applied to one input end of the differential amplifier circuit 314.

The differential amplifier 33 includes a differential amplifier circuit 314, which has two inputs: $V_2$ from the first mirror circuit 32 and $V_4$ from the second mirror circuit 34. The output voltage of the differential amplifier circuit 314, $V_3$, provides the bias voltage for the switch device 318 in the second mirror circuit 34 and the switch device 305 in the bias circuit 35.

The differential amplifier circuit 314 receives feedback voltage from the first mirror circuit 32, which has the same mirror current Iref as the constant current circuit 31, and also from the second mirror circuit 34, which has the same mirror current $I_{OD}'$ as the bias circuit 35. The feedback mechanism provides a reference generator which can compensate the resistances of the switches 307 and 308. The differential amplifier compares the two input voltages and generates an adjusted bias voltage $V_3$ for the driver. One input to the differential amplifier on the left is similar to $V_{CC}$-Iref*R (the resistance of resistor 312) which is a function of the reference current Iref. The other input to the right is like $V_{CC}$-$I_{OD}$*R (the resistance of resistor 315) which is a function of the driver current $I_{OD}$. If $I_{OD}$ is smaller than Iref due to the resistance of switches, then the right input voltage $V_{CC}$-Iref*R will be larger than the left one. This voltage difference causes the differential amplifier 314 to increase its output voltage $V_3$ to reduce the input voltage difference. This negative feedback loop tries to minimize the input voltage difference and outputs an adjusted voltage $V_3$, compensating the switch resistance.

In some embodiments, the above switch devices may comprise an n-channel MOS transistor or a p-channel MOS transistor.

Figure 1:
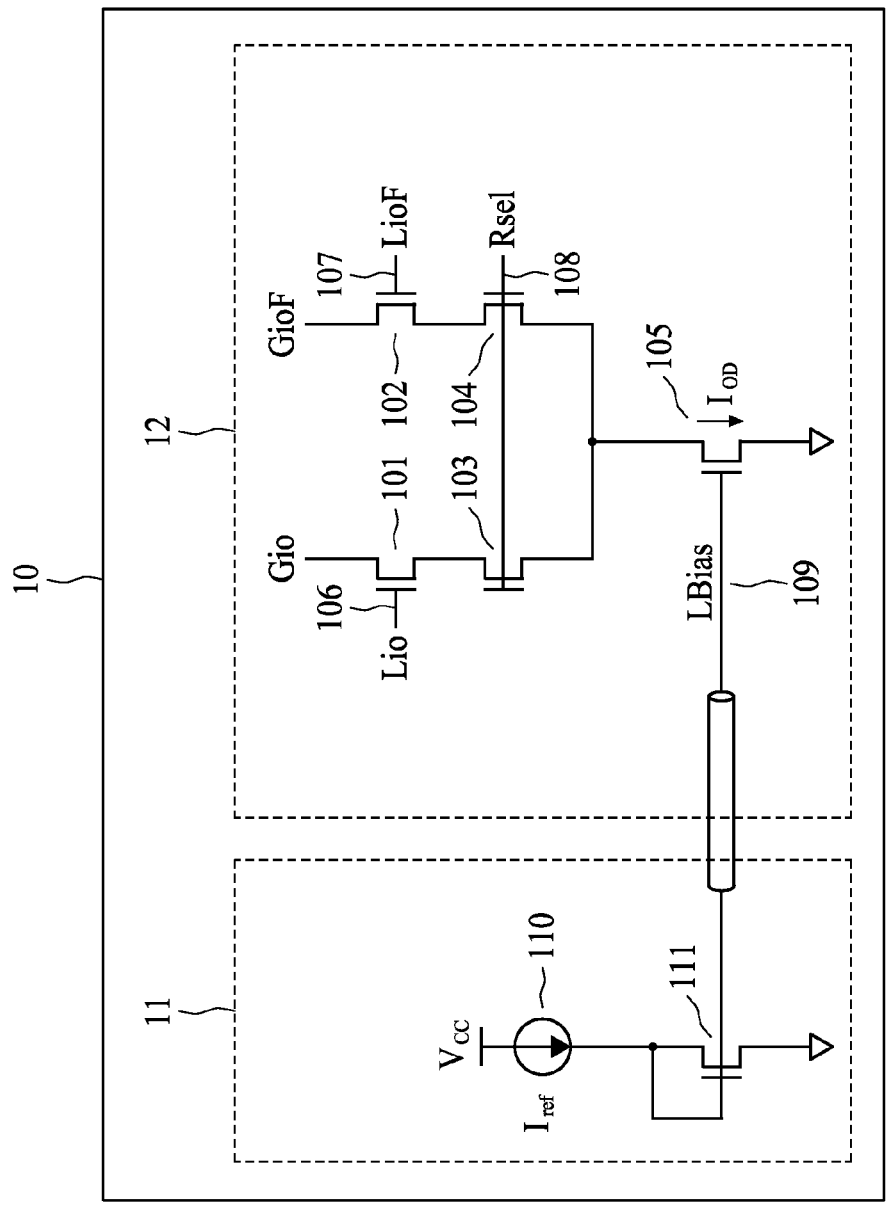
FIG. 1 shows a conventional signal driver.
Figure 4:
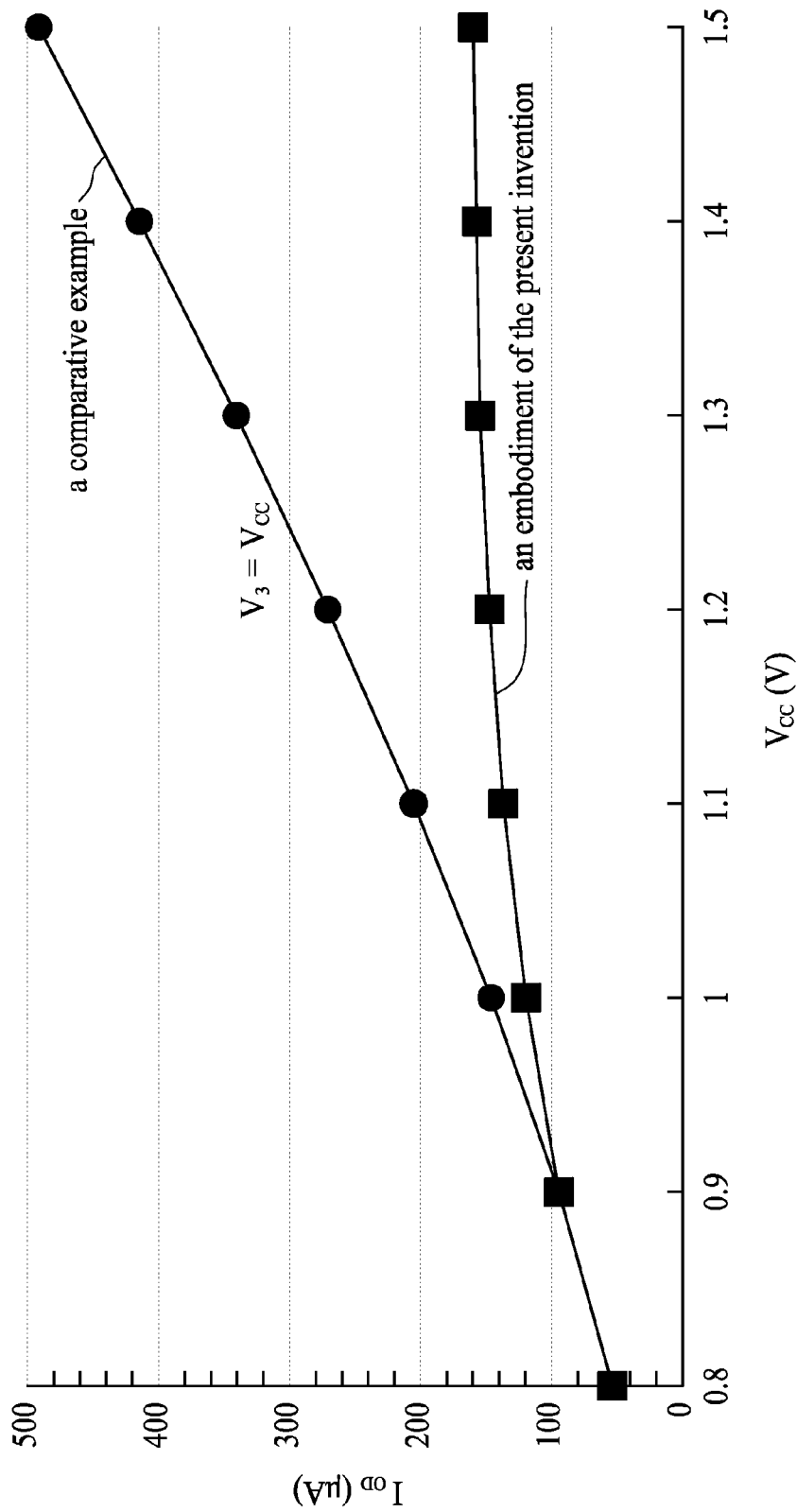
FIG. 4 is a diagram showing the relationship between a driver current and a voltage source according to one embodiment of the present invention.

FIG. 4 shows simulated results of a conventional device as shown in FIG. 1 and an embodied device of the present invention. As shown in FIG. 4, the embodied device of the present invention can provide lower $I_{OD}$ when the $V_{CC}$ is high. The comparative example provides enough $I_{OD}$ but waste too much power at high $V_{CC}$ when $V_3=V_{CC}$, which is very OK for low $V_{CC}$. The present invention provides constant $I_{OD}$ over high $V_{CC}$ range and thus keeps from wasting too much power.

Figure 5:
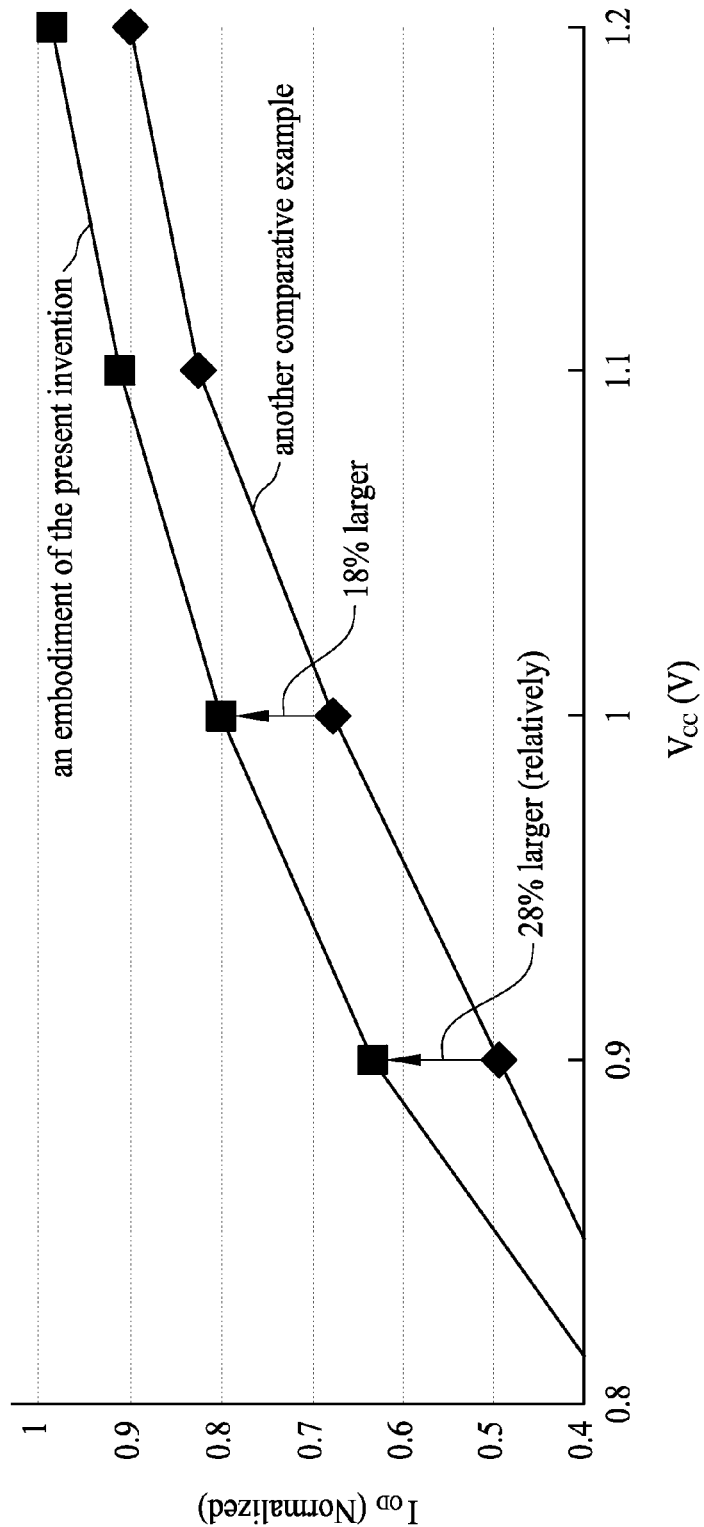
FIG. 5 is a diagram showing the relationship between a normalized driver current and a voltage source according to one embodiment of the present invention.

FIG. 5 shows a comparison of $I_{OD}$ values for another conventional device and an embodied device of the present invention. Another comparative example in FIG. 5 is for $V_3=V_1$ (in FIG. 3), which can avoid power waste at high $V_{CC}$ but suffer from low $I_{OD}$ due to switch resistance. Compared to the conventional device, the embodied device can have an improvement of from 18% to 28% at low $V_{CC}$.

In summary, the signal driver of the present invention can maintain very good power efficiency at higher $V_{CC}$ and can also provide a larger signal at low $V_{CC}$ compared to conventional signal drivers.

Although the present invention and its advantages have been described in detail, it should be understood that various changes, substitutions and alterations can be made herein without departing from the spirit and scope of the invention as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A signal driving device, comprising:
   a constant current circuit configured to provide a constant current;
   a first mirror circuit configured to generate a mirror current from the constant current and provide a voltage according to the mirror current of the constant current;
   a circuit comprising a switch device and configured to provide a driver current;
   a second mirror circuit comprising a replica switch device, configured to generate a mirror current of the driver current and output a voltage that includes a voltage drop caused when the mirror current of the driver current flows through the replica switch device; and
   a differential amplifier configured to receive the voltage from the first mirror circuit and the voltage from the second mirror circuit in order to provide a biased voltage for the bias circuit and thereby induce the driver current.

2. The signal driving device of claim 1, wherein the constant current circuit comprises the constant current source configured to provide the constant current.

3. The signal driving device of claim 1, wherein the constant current circuit further comprises a MOS transistor, wherein the MOS transistor is configured to provide the voltage to the first mirror circuit.

4. The signal driving device of claim 1, wherein the first mirror circuit comprises a resistor and a MOS transistor, wherein the mirror current is close to the constant current.

5. The signal driving device of claim 1, wherein the voltage from the first mirror circuit is applied to an input end of the differential amplifier.

6. The signal driving device of claim 1, wherein the voltage from the second mirror circuit is applied to another input end of the differential amplifier.

7. The signal driving device of claim 1, wherein the switch device comprises a plurality of first MOS transistors connected in series and a second MOS transistor coupled to one of the first MOS transistors, and the second mirror circuit comprises:
   a resistor;
   a plurality of replica first MOS transistors connected in series; and
   a replica second MOS transistor coupled to the plurality of replica first MOS transistors, wherein the biased voltage is applied to a gate end of the replica second MOS transistor.

8. A signal driving device comprising:
   a signal driver comprising a first switch device configured to launch a data signal from a first signal line to a second signal line, and comprising a second switch device comprising a gate end configured for application of a biased voltage to induce a driver current;
   a differential amplifier comprising a first input and a second input;
   a first generating circuit comprising a replica signal driver and a first resistor connecting a voltage source and the replica signal driver, wherein the first generating circuit is configured to generate a mirror current of the driver current flowing through the first resistor to induce a first voltage between the first resistor and the replica signal driver, wherein the first voltage is applied to the first end of the differential amplifier;
   a constant current source generating a reference current; and
   a second generating circuit comprising a replica second switch device and a second resistor connecting the voltage source and the replica second switch device, wherein the second generating circuit is configured for inducing a mirror current of the reference current flowing through the second resistor to output a second voltage between the second resistor and the replica second switch device, wherein the second voltage is applied to the second input of the differential amplifier.

9. The signal driving device of claim 8, wherein the first switch device comprises first and second transistors connected in series.

10. The signal driving device of claim 9, wherein the second signal line couples to an end of the first transistor, the first signal line couples to a gate end of the first transistor, and a gate end of the second transistor is configured for application of a selection signal.

11. The signal driving device of claim 9, wherein the first or second transistor is an n-channel MOS transistor or a p-channel MOS transistor.

12. The signal driving device of claim 8, wherein the second switch device comprises an n-channel MOS transistor or a p-channel MOS transistor.

13. A memory device, comprising:
a global input/output line and a local input/output line;
a signal driver, comprising:
   a first switch device configured to launching a data signal from the local input/output line to the global input/output line; and
   a second switch device comprising a gate end configured for application of a biased voltage to induce a driver current;
a differential amplifier comprising a first input and a second input;
a first generating circuit comprising a replica signal driver and a first resistor connecting a voltage source and the replica signal driver, wherein the first generating circuit is configured to generate a mirror current of the driver current flowing through the first resistor to induce a first voltage between the first resistor and the replica signal driver, wherein the first voltage is applied to the first end of the differential amplifier;
a constant current source generating a reference current; and
a second generating circuit comprising a replica second switch device and a second resistor connecting the voltage source and the replica second switch device, wherein the second generating circuit is configured for inducing a mirror current of the reference current flowing through the second resistor to output a second voltage between the second resistor and the replica second switch device, wherein the second voltage is applied to the second input of the differential amplifier.

14. The memory device of claim 13, wherein the first switch device comprises first and second transistors connected in series.

15. The memory device of claim 14, wherein the global input/output line couples to an end of the first transistor, the local input/output line couples to a gate end of the first transistor, and a gate end of the second transistor is configured for application of a selection signal.

16. The memory device of claim 13, further comprising a memory cell array comprising a sense amplifier coupled to the local input/output line.

17. The memory device of claim 14, wherein the first or second transistor is an n-channel MOS transistor or a p-channel MOS transistor.

18. The memory device of claim 13, further comprising a periphery circuit coupled to the global input/output line.

* * * * *